United States Patent [19]

Burns

[11] Patent Number: 5,561,591
[45] Date of Patent: Oct. 1, 1996

[54] MULTI-SIGNAL RAIL ASSEMBLY WITH IMPEDANCE CONTROL FOR A THREE-DIMENSIONAL HIGH DENSITY INTEGRATED CIRCUIT PACKAGE

[75] Inventor: Carmen D. Burns, Austin, Tex.

[73] Assignee: Staktek Corporation, Austin, Tex.

[21] Appl. No.: 289,468

[22] Filed: Aug. 12, 1994

Related U.S. Application Data

[63] Continuation-in-part of Ser. No. 561,417, Aug. 1, 1990, abandoned.

[51] Int. Cl.⁶ .................................................. H05K 7/20
[52] U.S. Cl. .......................... 361/704; 257/686; 257/712; 257/723; 361/712; 361/715; 439/540.1
[58] Field of Search ................................ 257/685, 686, 257/696, 712, 713, 718, 723; 361/688, 690, 704, 707, 712, 715–716, 719–721, 735, 744, 775, 790–792; 439/47, 60, 485–486, 540, 714

[56] References Cited

U.S. PATENT DOCUMENTS

| | | | |
|---|---|---|---|
| 3,746,934 | 7/1973 | Stein | 317/101 |
| 4,103,318 | 7/1978 | Schwede | 361/388 |
| 4,437,235 | 3/1984 | McIver | 29/840 |
| 4,521,828 | 6/1985 | Fanning | 361/386 |
| 4,525,921 | 7/1985 | Carson et al. | 29/577 |
| 4,763,188 | 8/1988 | Johnson | 357/74 |
| 4,862,249 | 8/1989 | Carlson | 357/80 |
| 4,878,106 | 10/1989 | Sachs | 357/72 |
| 4,884,237 | 11/1989 | Mueller et al. | 365/63 |
| 4,953,005 | 8/1990 | Carlson et al. | 357/80 |
| 4,953,060 | 8/1990 | Lauffer et al. | 361/388 |
| 4,956,694 | 9/1990 | Eide | 357/74 |
| 5,016,138 | 5/1991 | Woodman | 361/381 |
| 5,247,423 | 9/1993 | Lin et al. | 361/719 |
| 5,281,852 | 1/1994 | Normington | 257/685 |
| 5,343,075 | 8/1994 | Nishino | 361/744 |

FOREIGN PATENT DOCUMENTS

| | | |
|---|---|---|
| 0298211A2 | 4/1988 | European Pat. Off. . |
| 57-31166A | 2/1982 | Japan . |
| 58-96756A | 6/1983 | Japan . |
| 58-112348A | 7/1983 | Japan . |

OTHER PUBLICATIONS

Information allegedly written by Emory Garth regarding "Memory Stacks," Applicant received a facsimile from Emory Garth on Jan. 26, 1993, Applicant does not know when the information was written or its validity.

Catalog of Dense–Pac Microsystems, Inc. describing two products: DPS512X16A3 Ceramic 512K X 16 CMOS SRAM Module and DPS512X16AA3 High Speed Ceramic 512K X 16 CMOS SRAM Module, pp. 865–870.

"High Density Memory Packaging Technology High Speed Imaging Applications," Dean Frew, Texas Instruments Inc., *SPIE vol. 1346 Ultrahigh– and High–Speed Photography, Photonics, and Velocimetry* '90, pp. 200–209.

"Vertically–Integrated Package," Abstract, Alvin Weinberg, W. Kinzy Jones, *IEEE*, pp. 436–443. No known date.

"3D Interconnection For Ultra–Dense Multichip Modules," Abstract, Christian VAL, *IEEE*, pp. 540–547. No known date.

*Primary Examiner*—Gregory D. Thompson
*Attorney, Agent, or Firm*—Fulbright & Jaworski L.L.P.

[57] ABSTRACT

An electrically and thermally conductive rail assembly with impedance control for interconnecting individual level-one integrated circuit packages within a three-dimensional high density integrated circuit package, and methods of manufacturing same.

22 Claims, 6 Drawing Sheets

MULTI-SIGNAL RAIL ASSEMBLY WITH IMPEDANCE CONTROL FOR A THREE-DIMENSIONAL HIGH DENSITY INTEGRATED CIRCUIT PACKAGE

This is a continuation-in-part of application Ser. No. 07/561,417, filed Aug. 1, 1990, abandoned, the contents of which are hereby incorporated by reference for all purposes.

BACKGROUND OF THE INVENTION

1. Field of Invention

This invention relates to a method and apparatus for achieving a multiple signal impedance control rail for electrically interconnecting a plurality of ultra-thin molded integrated circuit packages stacked to form an ultra-high density three-dimensional module.

2. Discussion of the Related Art

One method of achieving an interconnected ultra high density integrated circuit package comprised of individual integrated circuit packages is to use a rail to interconnect external leads from each of the individual integrated circuit packages in the ultra high density integrated circuit package, or stack. This method is described in parent application Ser. No. 07/561,417, which is incorporated herein by reference.

In applications where the ultra high density integrated circuit stack, or package, comprises dissimilar integrated circuit devices, e.g. memory devices, microprocessor, DMA, etc., there is a need for a signal or enabling signal path that provides various internal interconnections between the individual, dissimilar integrated circuit devices which make up the stack or package, as well as external connections between the package as a whole, or selected individual devices in the stack and external circuitry.

As the number of individual integrated circuit packages which form the package increases, and as operating speeds approach and exceed 100 MHz, the need for impedance control of the packages as a whole and in particular for the external rails becomes critical. With high density stacks operating at 100 MHz, cross-talk between rail elements becomes problematic. Without impedance control, synchronous operation with outside devices is difficult since the impedance on each rail may cause differing amounts of signal delay. Therefore, impedance control of the rails is vital to maintain synchronous operation at high operating frequencies.

The prior art does not provide a method of easily controlling rail impedance. Also, the prior art does not allow multiple signal paths on a single rail or the ability to ground terminate a rail to control the impedance and inter-rail cross-talk.

Packaging techniques for integrated circuits have been developed in the past in an attempt to satisfy demands for miniaturization in the semiconductor industry. Improved methods for miniaturization of integrated circuits enabling the integration of millions of circuit elements into single integrated silicon embodied circuits, or chips, have resulted in increased emphasis on methods to package these circuits in space efficient, yet reliable and mass producible packages.

The introduction of highly sophisticated integrated circuit microprocessors led to the rapid development of complex personal computers and other common bus systems utilizing a variety of integrated circuit elements such as memory devices (DRAMs, SRAMs), programmable logic arrays (PLAs), microprocessors (CPUs), coprocessors, and other related integrated circuit elements which had to be assembled, mounted and interconnected into as compact, yet reliable packages as feasible to satisfy the industry demands for miniaturization.

In contrast to such prior art systems, the packaging method of the present invention provides a reliable, cost efficient, easily manufacturable package with a plurality of ultra thin level-one package elements assembled in an integrated module or level-two package which can be mounted to a printed circuit board directly or via an underlying socket or header. An integral part of the packaging method and apparatus of the present invention provides external rails or conductors having multiple signal path and ground plane elements to provide impedance control and selective interconnectivity among various level-one circuit packages in the level-two module.

SUMMARY OF THE INVENTION

The present invention solves problems encountered in the prior art for operating frequencies of integrated circuit devices of 100 MHz, or greater. The present invention provides a way to control the impedance characteristics of a rail to reduce delays, minimize cross-talk and enable high-frequency, low noise operation not achievable with prior art techniques.

The present invention incorporates one or more ground planes to eliminate or reduce cross talk between rail elements and to control rail assembly impedance. A ground plane is incorporated into the stack of discrete integrated circuits forming the high density package, or stack, and a ground element is also incorporated into the structure of the rail assembly. The improved rail assembly includes alternating, multiple layers of signal carrying conductors, electrically insulating adhesive and at least one conductive ground plane.

The present invention not only provides the capability to control impedance related factors, but also provides a unique means to provide both common and unique signal paths between level-one packages and between level-one packages and external circuits. Each rail of the present invention may be made from multiple layers of thin metal, adhesive and ground plane. A first thin metal layer, which provides a signal path is coated with a high temperature, electrically insulating adhesive layer. A second conductive, preferably metal element is formed over the adhesive layer to serve as a ground plane, which may be connected to a ground plane in the level-two package and/or to an external device ground. An additional adhesive layer may be applied over the ground plane, followed by an additional thin metal layer adhered to the additional adhesive layer, which comprises the other outside surface of the rail and another signal path. This pattern can be repeated to provide virtually unlimited circuit interconnectivity.

For more complex interconnectivity problems, the first outside metal layer, or signal path, or the second outside metal layer, or signal path, or both, may each be subdivided into two or more sections which may or may not be electrically connected with each other. Each rail signal path section may be electrically connected to some, but not all, of the individual integrated circuit packages comprising the ultra high density level-two package.

Thus, in the case where the level-two package includes several SRAM devices, a DMA device, and a microprocessor, a particular rail signal path section might be electrically connected to address or data pins of only a portion of the various dissimilar integrated circuit packages within the stack. For example, the DMA device in the stack may communicate with both an upper and lower section of a rail signal path, where the individual signal path sections are not coupled together. The DMA device may address high memory SRAMs by connecting with an upper signal path section which is only connected with the DMA and high memory SRAM devices, and may address lower memory SRAM devices in the stack by connecting to the lower rail signal path section, which is only connected to the DMA and lower memory SRAM devices.

In this manner, the DMA device can access data from upper or lower memory SRAM by utilizing an upper or lower signal path section on one or more rails of an ultra high density integrated circuit stack without having to address and enable all SRAMs in the stack, or go out of the package to provide addressing capability. This reduces access times and increases system operating throughput for systems utilizing this invention. It also provides a way for dissimilar devices within a stack to communicate with each other internally through the use of multiple path signal rails of the present invention.

External leads on the integrated circuits in the ultra high density integrated circuit package of the present invention are formed so that selected lead ends are configured as a multi-faceted surface, a set of prongs, or tabbed surface contacts. Each type of lead end configuration is capable of electrically connecting with a separate rail signal path contained within each multiple signal path rail. For example, for a rail containing two signal paths, each located on an outside surface of the rail, each device lead end extending from a level-one package will include, for example, two prongs. The multiple signal rail is received between the prongs and depending on which rail signal path is to be utilized, the prong adjacent to that signal path is bent into contact with and soldered or otherwise secured to the signal path, and the other prong is removed or otherwise left unconnected to a rail signal path. Alternatively, where desired, the second prong could be coupled to a second signal path thereby coupling the two otherwise independent signal paths together. Typically, however, the lead ends are connected so that each integrated circuit level-one device in the stack may communicate through the two prong lead end electrically connected to the multiple signal rail, with either the rail signal path which is connected with devices external to the stack, or the rail signal path connected to devices within the stack.

In the preferred embodiment, a horizontally stacked level-two module comprised of multiple level-one integrated circuit packages, such as DRAMs, SRAMs, controllers or the like, are bound together in a horizontal, module or level-two package. In this embodiment electrical interconnection and thermal conduction are provided by an array of vertically oriented conductive rails aligned with the vertical columns of leads, and extending from the top to the bottom of the stack. These rails can be configured with SMT gull-wing leads or J-leads for the package. Significant advantages are realized by incorporating an electrical signal bus and integral heat sink in the vertical rails which also provide structural integrity for the horizontal module. In all embodiments provision can be made for de-coupling capacitors, control circuitry, self-contained power supplies or other components as elements in the stack and configured with external heat sinking.

The computer systems of today and tomorrow are being designed with ever increasing clock rates. With the clock rates of personal computers operating at 50 MHz, a single cycle memory access must be accomplished in 20 nano seconds (ns). If a static ram in a cache memory application has a 15 ns access time capability, only 5 ns is left to accommodate any gate and/or propagation delays to meet a single cycle memory access. A fast memory driver chip typically has a 3 ns gate delay, leaving 2 ns overhead. In a standard memory array assembled two dimensionally across an FR-4 type printed circuit board (PCB), the propagation delay could be larger than 2 ns and force a two cycle, 40 ns access, thus greatly affecting the overall system performance. The three-dimensional modular approach described herein provides for significantly shorter, lower impedance routing paths to the memory arrays, and the potential to support a single-cycle access. This invention can be used with applications involving system operations at 100 MHz or greater.

A unique feature of the horizontally oriented level-two module or package is the relatively large cross-sectional area of the rails connecting the leads of the level-one packages. These rails act as excellent low impedance buses for both electrical current flow and thermal heat transfer. The low electrical impedance provides for less ground bounce, less signal distortion, and improved signal integrity. The low thermal resistance allows for improved heat transfer from the die interior, which provides increased reliability and longer operating life for some embodiments, and in ultra-high density embodiments provides a package that can be adequately heat compensated with conventional convection techniques.

DETAILED DESCRIPTION OF THE PREFERRED EMBODIMENT

A better understanding of the present invention can be had when the following detailed description is read with reference to the drawings wherein common elements are designated with like numbers or letters.

Figure 1:
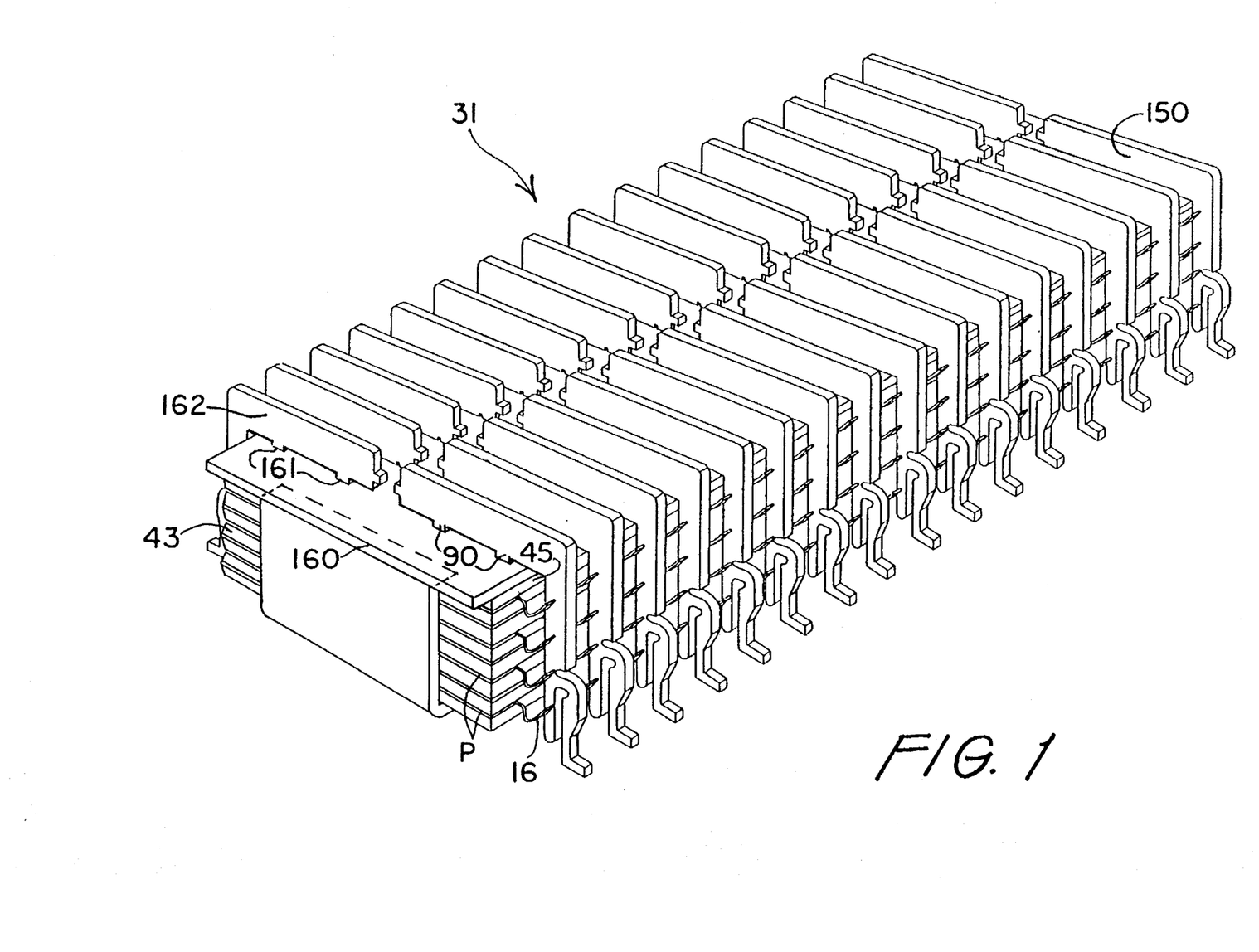
FIG. 1 is a perspective view of an embodiment of a three-dimensional high density integrated circuit package, including a plurality of level-one packages, of the present invention.

Referring to FIG. 1, the individual level-one packages P are assembled in a horizontally oriented level-two three-dimensional integrated circuit package 31. Each level-one package P is individually assembled, selected and tested prior to assembly in package 31. Package 31 includes level-one packages P stacked, which are connected to electrically and thermally conductive external rail assemblies 150 via leads 16, and a cap member 160. Cap member 160 must be electrically isolated from rail assemblies 150 and preferably should be formed of thermally conductive material. In addition to non-conducting plastics such as RYTON, cap 160 can be formed of heat conductive materials such as plastic coated aluminum or preferably hardanodized aluminum without coating.

Cap 160 includes a plurality of slots 161 formed to be aligned with tabs 90 formed along the upper portion 162 of rail assemblies 150. Once the three-dimensional package 31 including the stack of packages P are assembled, cap 160 is attached to the upper surface of package 31, with tabs 90 along upper portion 162 of rail assemblies 150 extending through slots 161 and bent over. This secures rail assemblies 150 to cap 160.

Heat is conducted from the level-one packages P via leads 16 to rail assemblies 150 and thereafter dissipated in the ambient atmosphere.

Figure 3:
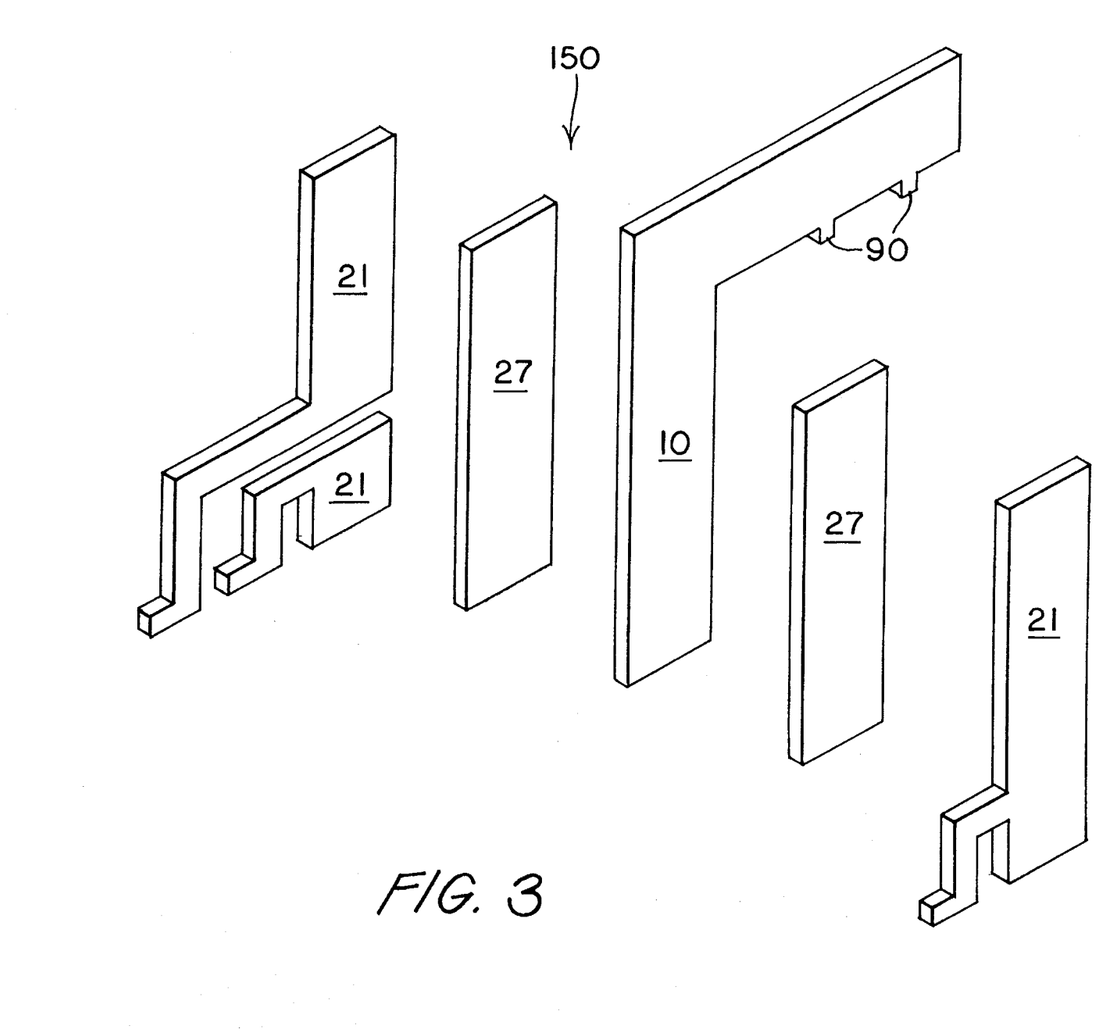
FIG. 3 is an exploded view of another embodiment of the multi-signal rail of the present invention.

Referring to FIG. 3, one embodiment of a multi-signal rail assembly 150 is shown with a ground plane conductor 10 sandwiched between two electrical signal conductors 21, which may be thin sheet metal or any other conductive rigid material, such as copper. Between each signal conductor 21 and ground plane conductor 10 is a high temperature dielectric material 27. The high temperature dielectric material 27 is used because it does not conduct electrical current. In addition, dielectric material 27 can be a high temperature adhesive material, a high temperature epoxy or a double-sided adhesive tape, such as Kapton. Also, a high temperature thermal plastic may be used to bind rail assembly 150 ground plane conductor 10 with each electrical signal conductor 21.

As shown in FIG. 3, this embodiment of rail assembly 150 is capable of conducting electrical signals on either outside surface of the assembly via an electrical signal conductor 21, while the impedance of rail assembly 150 is controlled by ground plane conductor 10, which is sandwiched between electrical signal conductors 21. Ground plane conductor 10 can be grounded to reduce cross-talk between the conductors 21. With integrated circuit operating speeds approaching 100 MHz, it becomes imperative to reduce signal delay, caused by higher impedance and cross-talk to ensure synchronous communication between system devices.

Figure 2:
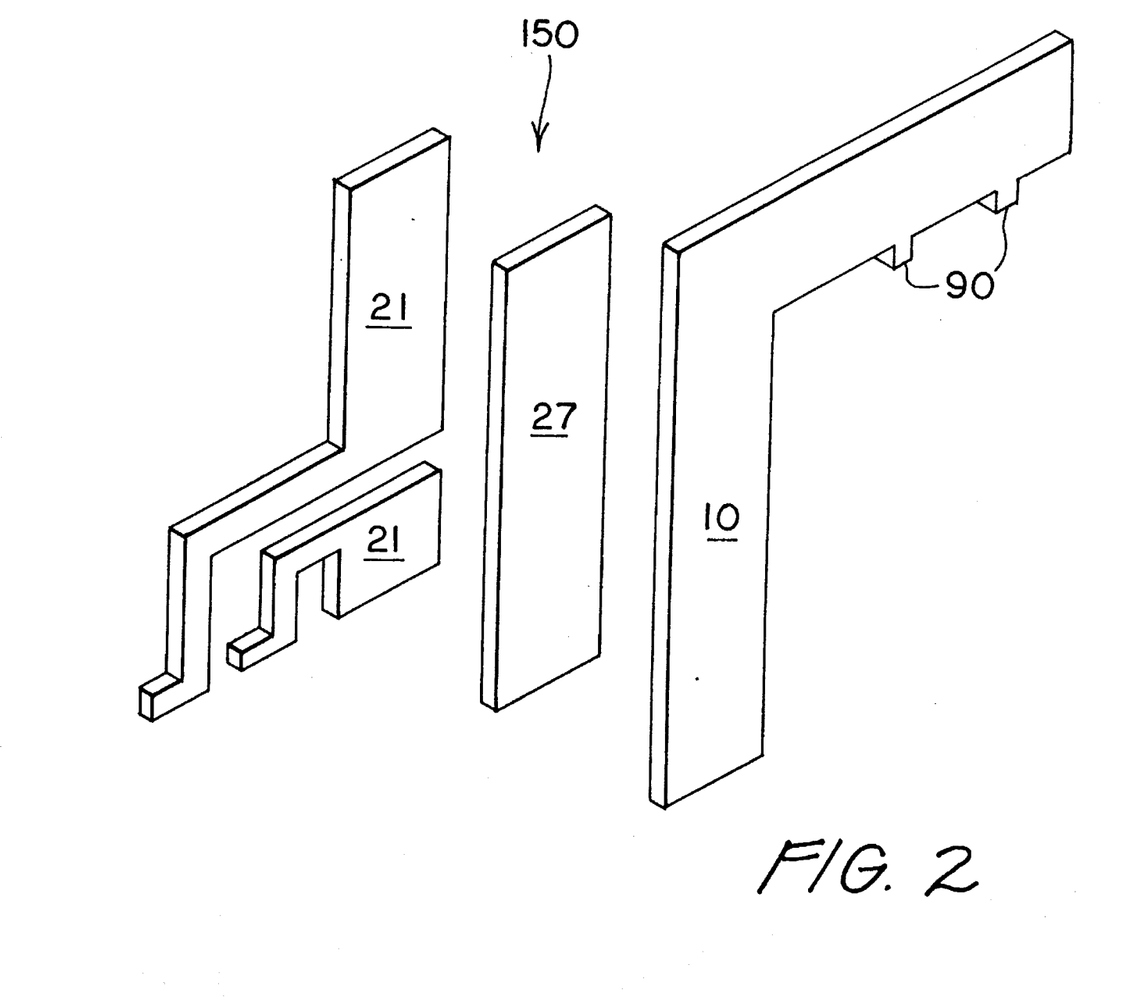
FIG. 2 is an exploded view of an embodiment of the multi-signal rail of the present invention.

In another embodiment, shown in FIG. 2, rail assembly 150 is configured with an outside surface ground plane conductor 10 and an outside surface electrical signal conductor 21, which are separated by a high temperature dielectric material 27. In this configuration, rail assembly 150 is capable of conducting electrical signals on electric conductor 21 while rail assembly impedance is controlled via ground plane conductor 10. Cross-talk between rail assemblies can be reduced by using this configuration.

As shown in FIG. 1, a three-dimensional ultra high density integrated circuit package 31 can be achieved by stacking individual level-one integrated circuit packages P. Individual level-one packages P can be interconnected, both electrically and thermally, by use of rail assemblies 150. Leads 16 extending from the stacked integrated circuit packages P can be interconnected, both electrically and thermally, via rail assembly 150 of the present invention.

Each lead 16 in the three-dimensional integrated circuit package 31 has a lead end 35 that is formed to receive and electrically and thermally connect with rail assembly 150. Lead end 35 may have a multi-faceted surface, tabs, prongs or other configuration suitable for electrically and thermally connecting with rail assembly 150 and the various electrical signal conductor and ground plane conductors rail assembly 150 may contain.

Figure 4:
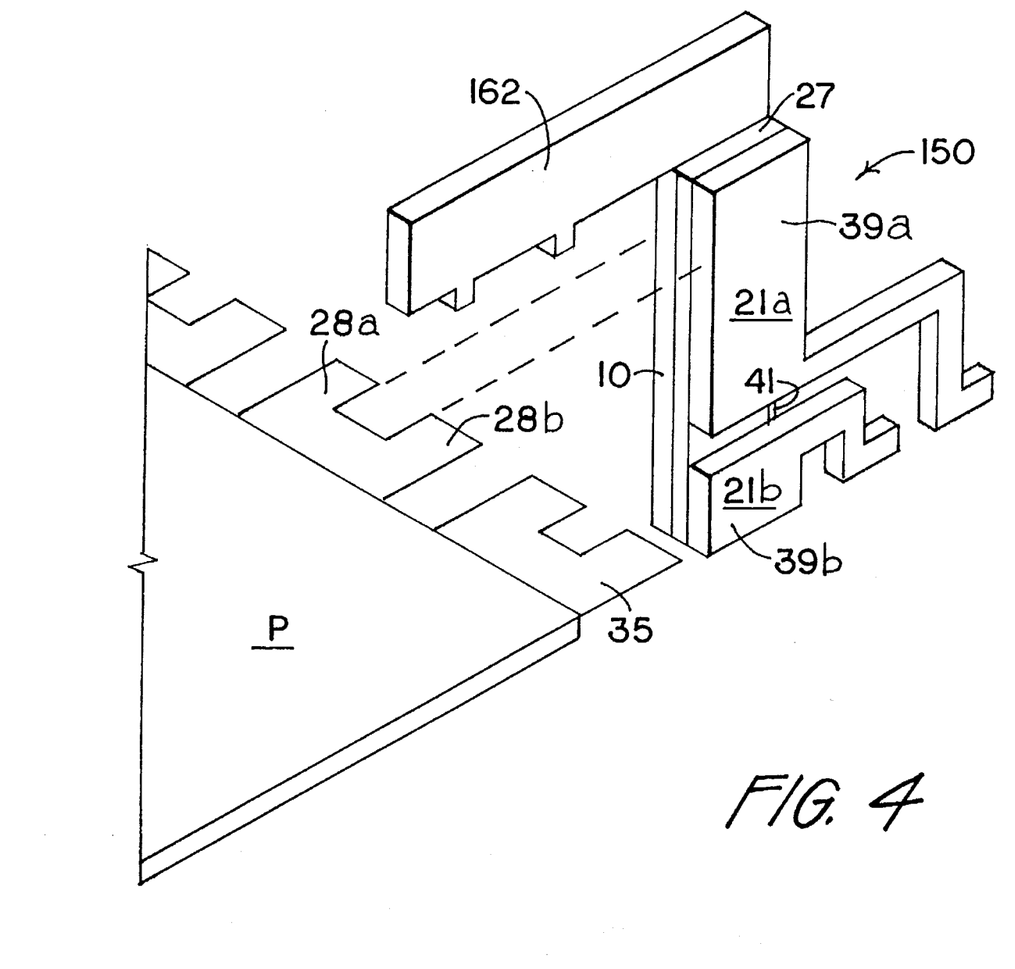
FIG. 4 illustrates how the multi-signal rail is received by a lead on a level-one package.
Figure 5:
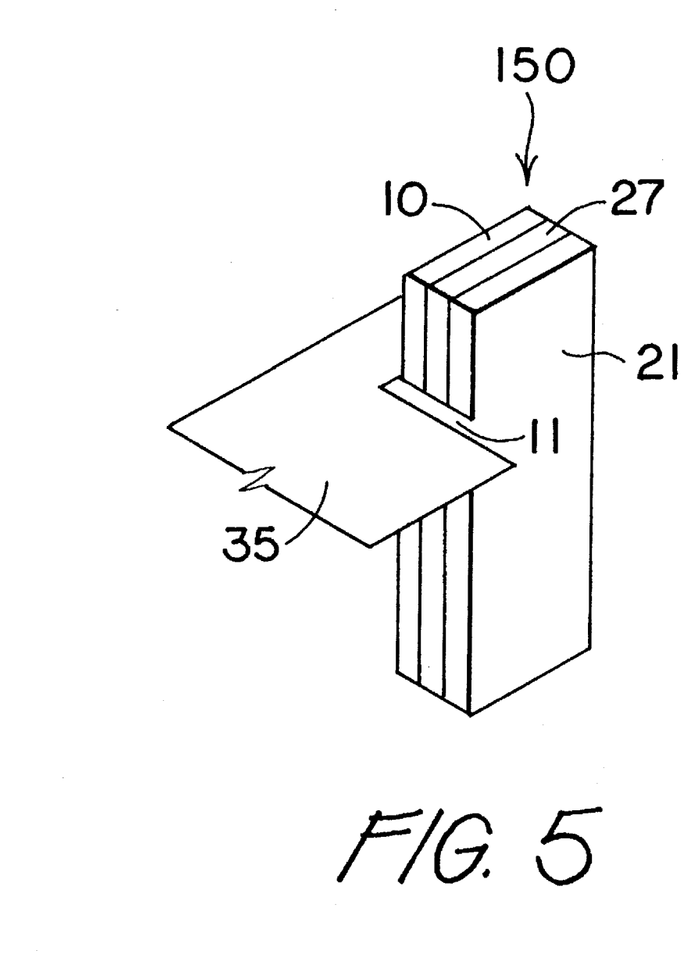
FIGS. 5 and 6 illustrate alternative configurations of lead ends used to electrically connect with either side of a multi-signal rail.
Figure 6:
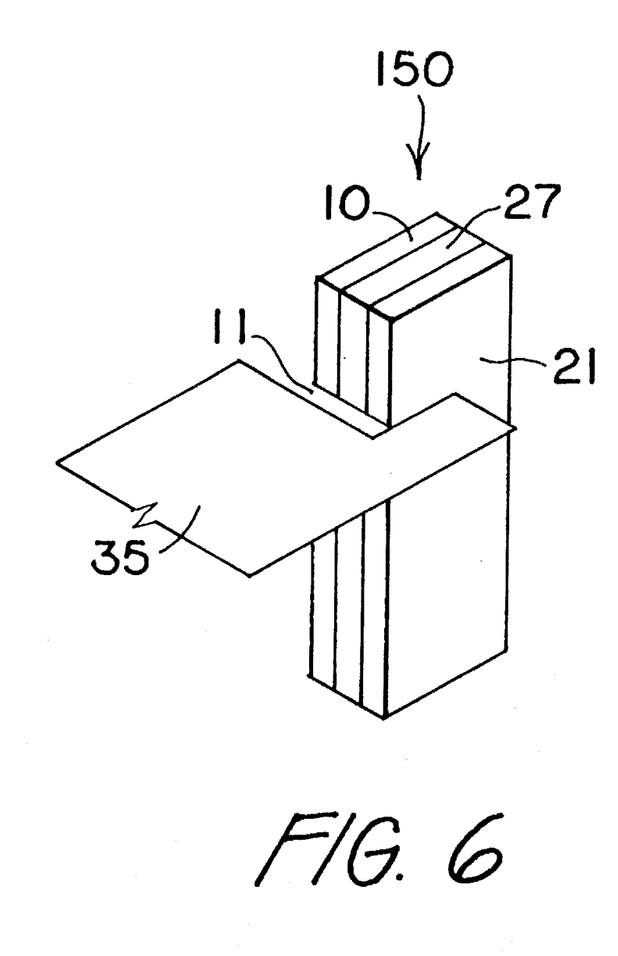

Referring now to FIGS. 4–6, lead end 35 of lead 16 receives and electrically and thermally connects to rail assembly 150. Ground plane conductor 10 of rail assembly 150 can be selectively connected to lead end 35 of lead 16 by bending tab 28a into contact with ground plane conductor 10 and soldering, or otherwise electrically and thermally connecting tab 28a to ground plane conductor 10. In this case, tab 28b is removed or bent away from rail assembly 150 to avoid electrical contact. In another selected configuration, tab 28b can be connected to lead end 35 of lead 16 by bending and soldering, or otherwise electrically and thermally connecting, tab 28b to electrical signal conductor 21 of rail assembly 150. In this case tab 28a is removed or bent away from rail assembly 150 to avoid electrical contact.

It should be noted that when selective connection between either tab 28a or tab 28b is made to conductor 10 or 21, respectively, spacing between lead end 35 and rail assembly 150 is maintained to avoid shorting to the non-selected conductor. This spacing is illustrated in FIGS. 5,6 by arrow 11.

In three-dimensional package 31, lead end 35 of lead 16 should typically be electrically connected to either ground plane conductor 10 or electrical conductor 21 of rail assembly 150, but not both. If both tabs 28a and 28b of lead end 35 were connected to rail assembly 150, lead 16 would be shorted to ground. If it is desired that lead 16 be connected to ground, it is desirable to only connect tab 28a of lead end 35 to ground via ground plane conductor 10 of rail assembly 150. Tab 28b should be broken off or otherwise disconnected from lead end 35 to avoid connecting lead 16 with electrical conductor 21.

Typically, leads 16 of the three-dimensional integrated circuit package 31 are arranged in a row and column configuration. This type of configuration is not necessary, but is preferred in order to more easily attach rail assembly 150 to each column of leads 16 without having to bend or otherwise deform rail assembly 150 in order to connect to a column of leads in package 31. When leads 16 are arranged in a row and column configuration (FIG. 1), rail assembly 150 may be aligned in a straight column, with all leads 16 receiving rail assembly 150 in an essentially straight line.

As shown in FIG. 3, rail assembly 150 may have two outside surface electrical signal conductors 21 and an internal ground plane conductor 10. A high temperature dielectric material 27 is applied between each electrical conductor 21 and ground plane conductor 10. In this configuration, ground plane conductor 10 reduces cross-talk between each electrical conductor 21 is reduced in this configuration, as well as rail impedance. Rail assembly 150 may also include more than one internal ground plane conductor 10 sandwiched between two electrical signal conductors 21, such that the high temperature dielectric material 27 is applied between each electrical signal conductor 21 and ground plane conductor 10, and between each ground plane conductor 10 and any adjacent ground plane conductor 10.

Figure 3A:
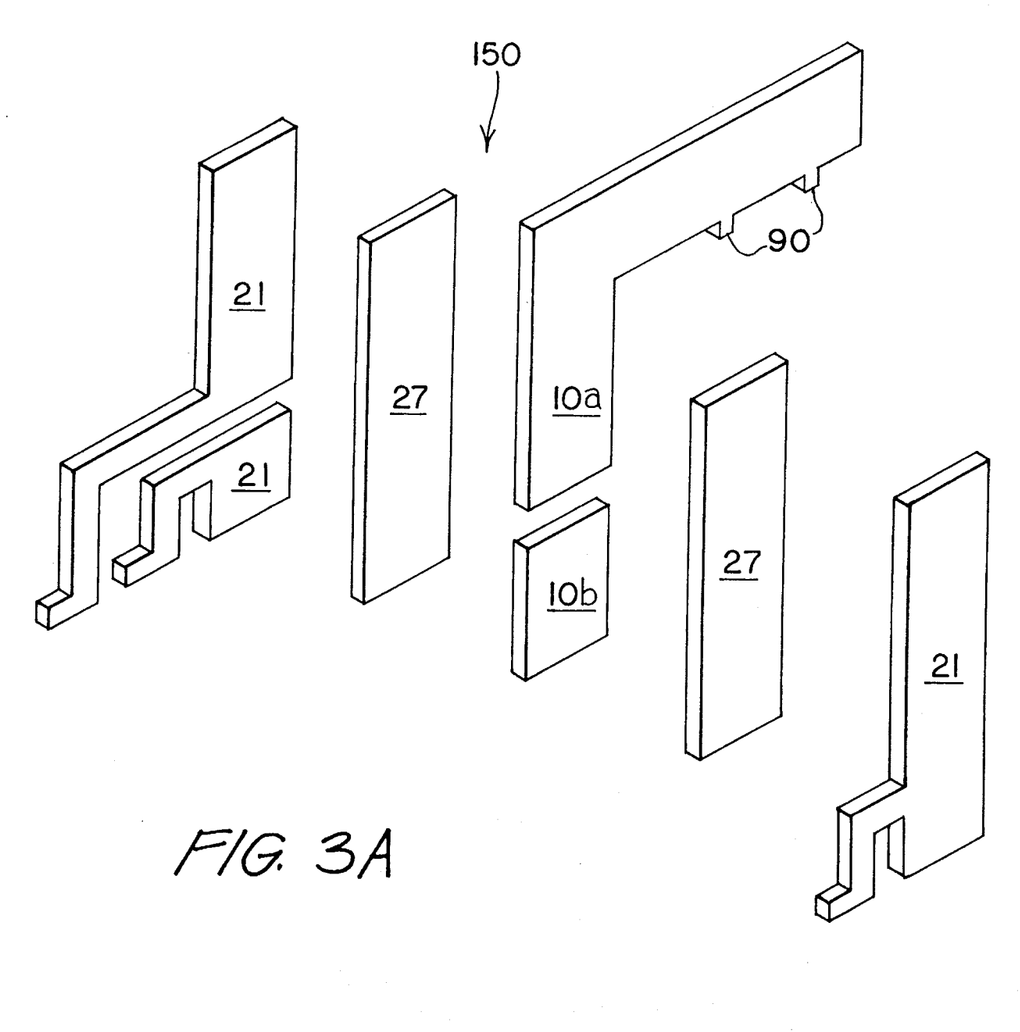

Referring to FIG. 3a, ground plane conductor 10 includes a separate section 10a and 10b.

Referring to FIG. 4, electrical conductor 21 may be configured as two or more electrical signal conductors 21a and 21b, which may or may not be electrically connected with each other via a signal bridge 41. Each electrical conductor 21a and 21b makes up a signal sections 39a and 39b which are electrically connected to at least two individual level-one integrated circuit packages P within the three-dimensional package 31. In this configuration, each signal sections 39a and 39b operate as an internal signal bus capable of conducting electrical signals between two or more individual level-one integrated circuit packages P.

The rail assembly 150 of the present invention allows great flexibility in configuring a variety of signal bus connections between various individual level-one packages P in any three-dimensional package 31. The individual level-one packages P may be dissimilar, i.e. a DMA, memory, microprocessor, buffers, logic circuit, etc. A rail assembly 150 can be configured to allow any of the dissimilar level-one integrated circuit packages P within the three-dimensional integrated circuit package 31 to communicate internally with each other electrical signal conductors 21 configured as an internal signal bus, or externally via a rail assembly, configured as an external signal bus.

Any rail assembly 150 can be configured as an internal signal bus or as an external signal bus, depending on whether the signal sections 39a or 39b is electrically connected to external signals (i.e., signals propagating to and/or from three-dimensional integrated circuit package 31) or to signals within internal package 31.

If an entire rail assembly 150 is to be configured as an external signal bus, all lead ends 35 of each lead 16 which receives that rail assembly 150 are electrically connected to the rail assembly 150 so that each tab 28b is bent over and soldered, or otherwise connected, with one electrical conductor 21, preferably on the outside of rail assembly 150, whereby that electrical conductor 21 is continuous throughout the length of rail assembly 150 and is not sectioned by a severed signal bridge 41. The remaining tabs 28a are broken off, or otherwise disconnected, and are not electrically connected to that rail assembly 150.

If any rail assembly 150 is to be configured as an internal signal bus, at least one electrical conductor 21 in that rail assembly 150 will contain multiple sections 39a and 39b with a severed signal bridge 41. As can be seen in FIG. 4, to configure the rail assembly 150 as an internal signal bus, signal bridge 41 can be severed which will electrically separate signal sections 39a and 39b of electrical conductor 21. If level-one individual integrated circuit packages P in three-dimensional package 31 are to communicate internally with each other via a DMA controller 43 situated in package 31, DMA controller 43 may be electrically connected to both signal sections 39a and 39b. Integrated circuit packages, such as memory devices, situated in the top half of package 31 are electrically connected to rail assembly 150 only via upper signal section 39a, while other memory devices in the lower half of package 31 are electrically connected to rail assembly 150 only via signal section 39b.

In FIG. 1, a DMA controller 43 can access upper memory devices located on the upper half of package 31 and lower memory devices located in the lower half of package 31 by electrically connecting to rail assembly 150 via both signal sections 39a and 39b without having to perform off-chip operations and experience delays associated with such operations. DMA controller 43 may connect externally with other devices over other rails in package 31 which are configured as external signal buses.

In other embodiments of the present invention, additional ground plane conductors 10 and electrical signal conductors 21 can be used within each rail assembly 150. With each added ground plane conductor 10 or electrical signal conductor 21, a high temperature dielectric material 27, preferably an adhesive, is applied between it and every other ground plane conductor 10 or electrical conductor 21 within the rail assembly 150. Thus, a rail assembly 150 may include a number of ground plane conductors 10 and/or electrical conductors 21, each separated by a high temperature dielectric material 27. Any combination of internal signal buses can be formed by severing one or more signal bridges 41 between the various signal sections 39a and 39b. Thus, the signal rail assembly 150 of the present invention provides multiple signal paths for level-one integrated circuit package P outputs and/or inputs for internal communication within the three-dimensional ultra high density package 31.

In FIG. 1, a three-dimensional package 31 is shown where rail assemblies 150 extend over the top of package 31. In another embodiment (not shown), each rail assembly 150 could extend over the top of package 31 a distance greater or less than the rail assembly 150 immediately adjacent to it so that rail assemblies 150 would extend over package 31 and overlap. This overlapping gives structural strength to the three-dimensional package 31.

The rail assemblies 150 can be formed in the shape of fins, as shown in FIG. 1, or any other shape suitable for effectively transferring heat from the three-dimensional package 31 to the ambient atmosphere. With or without being shaped as fins, rail assemblies 150 act as a heat sink for package 31 and individual level-one integrated circuit packages P making up package 31.

FIG. 1 shows a horizontal ground plane 45 on top of the three-dimensional package 31 below cap 160. Rail assembly 150 is shown extending over package 31, whereby ground plane conductor 10 is soldered, or otherwise electrically connected to the horizontal ground plane 45. This configuration reduces cross-talk and delay effects caused by high impedance while operating at or above 50 MHz.

In other embodiments, horizontal ground plane 45 can be situated anywhere within the three-dimensional package 31 in place of a level-one integrated circuit package P. In other embodiments, more than one horizontal ground plane 45 may be used within package 31. Any of these horizontal ground planes 45 can be connected to any or all rail assemblies 150 of package 31 by electrically connecting to any ground plane conductor 10 of a rail assembly 150.

A multi-signal rail assembly 150 of the present invention can be formed by laminating thin metal sheets together using high temperature adhesive to form a multi-layered blank. The multi-layered blank is then cut, or otherwise separated, into a rail pattern using a laser, a punch press or other device or method suitable for quickly and accurately creating a rail pattern from the multi-layered blank.

Using another process, the rail patterns can first be cut out, or otherwise removed, from thin metal sheets using the methods described above and can then be adhered together with a high temperature adhesive to form a rail assembly of the present invention.

The foregoing disclosure and description of the invention are illustrative and explanatory of the preferred embodiments, and changes in the size, shape, materials and individual components, circuit elements, connections and construction may be made without departing from the spirit of the invention.

What is claimed is:

1. An electrically and thermally conductive rail assembly for a three-dimensional integrated circuit package, said three-dimensional package including a plurality of level-one integrated circuit packages, said rail assembly comprising:

a plurality of thermally and electrically conductive rails, wherein selected rails further comprise an electrical signal element, a ground plane element and an insulating element, wherein said insulating element electrically insulates said signal element from said ground plane element, and wherein said electrical signal element is comprised of at least two electrically isolated conductive sections.

2. The rail assembly of claim 1, wherein said electrical signal element and said ground plane element of each said selected rail are laminated together by an insulating material.

3. The rail assembly of claim 1, wherein said rail assembly is adapted to extend over the uppermost surface of a three-dimensional integrated circuit package and is adapted to electrically connect to a ground plane disposed on the uppermost surface of said three-dimensional package.

4. The rail assembly of claim 1, wherein the impedance of said rail assembly is controlled by said ground plane element.

5. The rail assembly of claim 1, wherein said electrical signal element and said ground plane element are insulated by a high temperature dielectric material.

6. The rail assembly of claim 5, wherein said high temperature dielectric material comprises a high temperature epoxy.

7. The rail assembly of claim 5, wherein said high temperature dielectric material comprises a double-sided adhesive tape.

8. The rail assembly of claim 5, wherein said high temperature dielectric material comprises a high temperature thermal plastic suitable for binding said electrical and ground plane conductors together.

9. The rail assembly of claim 1, wherein said ground plane element comprises at least two sections.

10. The rail assembly of claim 1, wherein said electrical element is comprised of at least two sections which are not electrically connected to each other.

11. The rail assembly of claim 1, wherein said ground plane element is adapted to be electrically connected to one or more level-one integrated circuit packages.

12. The rail assembly of claim 1, wherein said rail assembly is adapted to be configured as a thermally conductive fin, or heat sink, for a three dimensional integrated circuit package.

13. An ultra high density three-dimensional integrated circuit package including a plurality of level-one integrated circuit packages, comprising a plurality of electrically and thermally conductive rail assemblies which interconnect said level-one integrated circuit packages; wherein each said rail assembly comprises:

(a) a plurality of electrical signal conductors;

(b) one or more ground plane conductors disposed between said electrical signal conductors; and (c) a high temperature dielectric material disposed between each electrical signal or ground plane conductor to bind said conductors together.

14. The three-dimensional package of claim 13, wherein said level-one integrated circuit packages have leads extending therefrom, wherein each lead includes an end suitable for receiving and electrically connecting to a rail assembly.

15. The three-dimensional package of claim 14, wherein a portion of each said lead end is capable of being removed so that said lead end can be electrically connected to only one electrical conductor on any said rail assembly.

16. The three-dimensional package of claim 14, wherein said leads are arranged in a row and column configuration.

17. The three-dimensional package of claim 14, wherein each said lead end is capable of electrically connecting to one or more of said ground plane conductors on each said rail assembly.

18. The three-dimensional package of claim 13, further comprising at least one horizontal ground plane disposed within said three-dimensional package in place of at least one of said level-one integrated circuit packages.

19. The three-dimensional package of claim 18, wherein at least one of said horizontal ground planes is electrically connected to at least one of said level-one integrated circuit packages.

20. The three-dimensional package of claim 18, wherein at least one of said horizontal ground planes is electrically connected to one or more of said ground plane conductors on at least one of said rail assemblies.

21. The three-dimensional package of claim 14, wherein each said lead end is electrically connected to only one of said electrical conductors on each said rail assembly.

22. The three-dimensional package of claim 14, wherein one or more of said electrical conductors on each of said rail assemblies comprises at least two sections which are not electrically connected to each other.

* * * * *